US011205691B2

(12) United States Patent
Sun et al.

(10) Patent No.: US 11,205,691 B2
(45) Date of Patent: Dec. 21, 2021

(54) DISPLAY PANEL AND DISPLAY DEVICE

(71) Applicant: BOE TECHNOLOGY GROUP CO., LTD., Beijing (CN)

(72) Inventors: Yanliu Sun, Beijing (CN); Ming Zhu, Beijing (CN); Ge Shi, Beijing (CN); Haijun Niu, Beijing (CN); Yuyao Wang, Beijing (CN); Shiyu Zhang, Beijing (CN); Song Yang, Beijing (CN); Zheng Fang, Beijing (CN); Jiahui Han, Beijing (CN); Yujie Liu, Beijing (CN); Hao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/821,125

(22) Filed: Mar. 17, 2020

(65) Prior Publication Data

US 2021/0036078 A1 Feb. 4, 2021

(30) Foreign Application Priority Data

Aug. 1, 2019 (CN) .......................... 201910708149.8

(51) Int. Cl.
*H01L 27/32* (2006.01)
*H01L 27/12* (2006.01)

(52) U.S. Cl.
CPC ...... *H01L 27/3262* (2013.01); *H01L 27/3272* (2013.01); *H01L 27/3276* (2013.01); *H01L 27/1214* (2013.01); *H01L 27/3211* (2013.01)

(58) Field of Classification Search
CPC ............. H01L 27/3262; H01L 27/3272; H01L 27/3276; H01L 27/1214
(Continued)

(56) References Cited

U.S. PATENT DOCUMENTS 6,040,936 A * 3/2000 Kim ....................... G02B 5/008
359/245
2003/0211697 A1* 11/2003 Hsu ..................... H01L 29/6656
438/305
(Continued)

FOREIGN PATENT DOCUMENTS

| CN | 109360840 A | 2/2019 |
| CN | 109599414 A | 4/2019 |
| CN | 109920822 A | 6/2019 |

OTHER PUBLICATIONS

English Machine Translation of CN109360840 (Year: 2019).*
(Continued)

*Primary Examiner* — Dzung Tran
(74) *Attorney, Agent, or Firm* — Kinney & Lange, P.A.

(57) ABSTRACT

A display panel and a display device are provided, and the display panel includes a substrate and a pixel layer disposed on the substrate. The pixel layer includes a plurality of pixel units arranged in an array. The display panel includes a main light-transmitting region surrounded by the plurality of pixel units, and an orthographic projection of the main light-transmitting region on the substrate is not overlapped with orthographic projections of the plurality of pixel units on the substrate, so that external light is allowed to pass through the main light-transmitting region of the display panel, and then is received by an image acquisition device disposed on a side of the display panel.

13 Claims, 6 Drawing Sheets

(58) Field of Classification Search
USPC .......................................................... 257/72
See application file for complete search history.

(56) References Cited

U.S. PATENT DOCUMENTS

| | | | |
|---|---|---|---|
| 2012/0064134 A1* | 3/2012 | Bourke, Jr. .............. | A61K 8/23 424/401 |
| 2012/0326180 A1* | 12/2012 | Ohe .................... | H01L 51/5265 257/88 |
| 2015/0293280 A1* | 10/2015 | Lee .................. | G02F 1/133514 359/891 |

OTHER PUBLICATIONS

English Machine Translation of CN109599414 (Year: 2019).*
First Chinese Office Action dated Jan. 19, 2021, received for corresponding Chinese Application No. 201910708149.8, 11 pages.

* cited by examiner

DISPLAY PANEL AND DISPLAY DEVICE

CROSS-REFERENCE TO RELATED APPLICATION

The present application claims the benefit of Chinese Patent Application No. 201910708149.8 filed on Aug. 1, 2019 in the National Intellectual Property Administration of China, the whole disclosure of which is incorporated herein by reference.

TECHNICAL FIELD

The present disclosure relates to the field of display technology, and in particular, to a display panel and a display device.

BACKGROUND

With the developments of science and technology, users' demand for high screen ratio of display devices is increasing. In order to meet the camera function, a front camera needs to be added to the display device. Correspondingly, a certain space needs to be reserved for the front camera in a display screen, for example, a physical through-hole is set in a display area of the display screen, thereby decreasing the screen ratio.

SUMMARY

Some embodiments of the present disclosure provide a display panel, comprising: a substrate; and a pixel layer disposed on the substrate, the pixel layer comprising a plurality of pixel units arranged in an array, wherein the display panel comprises a main light-transmitting region surrounded by the plurality of pixel units, and an orthographic projection of the main light-transmitting region on the substrate is not overlapped with orthographic projections of the plurality of pixel units on the substrate, so that external light is allowed to pass through the main light-transmitting region of the display panel, and then is received by an image acquisition device disposed on a side of the display panel.

In some embodiments, the display panel further comprising: an electrical control layer between the substrate and the pixel layer, the electrical control layer comprising a metal wiring and a switching element which collectively provide signals for the plurality of pixel units, wherein the orthographic projection of the main light-transmitting region on the substrate is not overlapped with orthographic projections of both the metal wiring and the switching element on the substrate.

In some embodiments, wherein the orthographic projection of the main light-transmitting region on the substrate is in a shape of a square or a circle.

In some embodiments, an area of the orthographic projection of the main light-transmitting region on the substrate is less than or equal to 2.25 mm$^2$.

In some embodiments, the area of the orthographic projection of the main light-transmitting region on the substrate is greater than or equal to $2.5 \times 10^5$ µm$^2$ and less than or equal to $1 \times 10^6$ µm$^2$.

In some embodiments, the display panel further comprising a plurality of auxiliary light-transmitting regions, wherein the plurality of auxiliary light-transmitting regions surround the main light-transmitting region.

In some embodiments, an orthographic projection of each auxiliary light-transmitting region on the substrate is not overlapped with the orthographic projections of the plurality of pixel units on the substrate.

In some embodiments, an orthographic projection of each auxiliary light-transmitting region on the substrate is not overlapped with the orthographic projections of both the metal wiring and the switching element on the substrate.

In some embodiments, the plurality of auxiliary light-transmitting regions are arranged evenly and spaced apart from each other, and each auxiliary light-transmitting region is located between adjacent pixel units.

In some embodiments, an area of an orthographic projection of each auxiliary light-transmitting region on the substrate is less than or equal to 900 µm$^2$.

In some embodiments, an orthographic projection of each auxiliary light-transmitting region on the substrate is in a shape of a square or a circle.

In some embodiments, the electrical control layer further comprises a light-shielding layer, the light-shielding layer is located on a side of the electrical control layer facing the substrate, and the light-shielding layer comprises a main opening and a plurality of auxiliary openings, each of the main opening and the auxiliary openings penetrating the light-shielding layer, and wherein the orthographic projection of the main light-transmitting region on the substrate coincides with an orthographic projection of the main opening on the substrate, and orthographic projections of the plurality of auxiliary light-transmitting regions on the substrate respectively coincide with orthographic projections of the plurality of auxiliary openings on the substrate.

Some embodiments of the present disclosure provide a display device, comprising: the display panel according to the above embodiments; and an image acquisition device on the side of the display panel, wherein an optical axis of the image acquisition device coincides with an axis of the main light-transmitting region perpendicular to the substrate.

In some embodiments, a field of view of the image acquisition device intersects with the display panel to define an area for the field of view on the display panel, the main light-transmitting region is located within the area for the field of view, and the main light-transmitting region is coaxial with the area for the field of view.

In some embodiments, the display panel further comprises a plurality of auxiliary light-transmitting regions, and the plurality of auxiliary light-transmitting regions are evenly distributed in the area for the field of view excluding the main light-transmitting region.

DETAILED DESCRIPTION OF THE EMBODIMENTS

Figure 1:
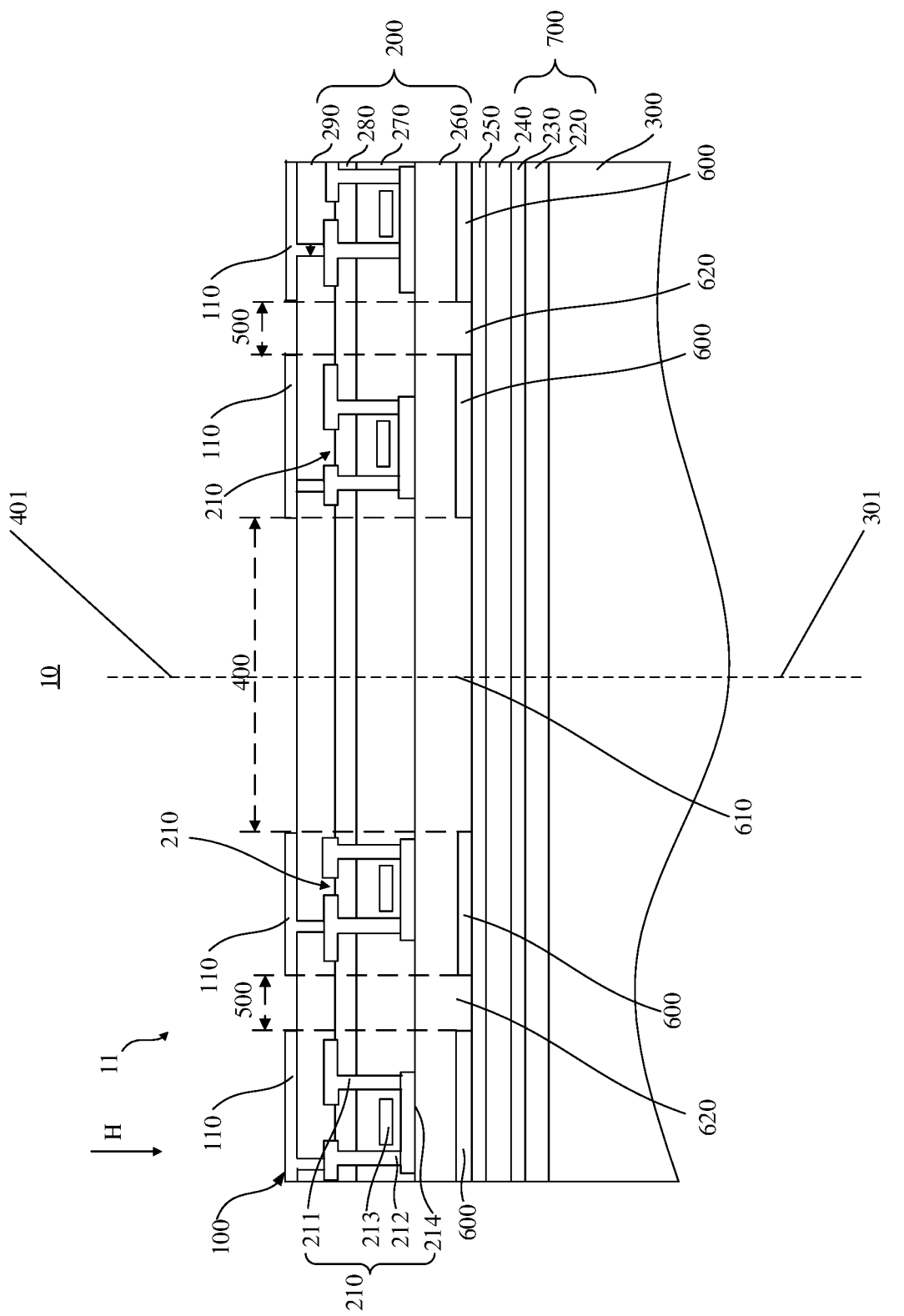
FIG. 1 is a schematic structural view of a display panel and an image acquisition device according to some embodiments of the present disclosure.

Exemplary embodiments will be described in detail herein, examples of which are illustrated in accompanying drawings. When the following description refers to the accompanying drawings, the same reference numerals in different drawings represent the same or similar elements, unless otherwise indicated. Implementations described in the following exemplary embodiments do not represent all implementations according to the present disclosure. Rather, they are merely examples of devices and methods according to some aspects of the present disclosure, which will be described in detail in appended claims.

Terminologies used in the present disclosure are only for the purpose of describing particular embodiments and are not intended to limit the present disclosure. As used in this disclosure and the appended claims, the singular forms "a", "an", "the" and "said" are intended to include the plural forms as well, unless the context clearly indicates otherwise. It should also be understood that a term "and/or" as used herein refers to any or all possible combinations that include one or more of associated listed items.

It should be understood that terms "first", "second", and the like used in the present disclosure and claims do not indicate any order, quantity, or importance, but are only used to distinguish different components. Similarly, words such as "a" or "an" do not indicate a limitation to quantity, but rather indicate that there is at least one. Unless stated otherwise, words such as "front", "rear", "lower" and/or "upper" are merely for convenience of explanation, and are not limited to a position or a spatial orientation. Words such as "include", "including", "comprise" or "comprising" mean that elements or items preceding the words contain elements or items following the words and their equivalents, and do not exclude other elements or items. Words such as "connecting" or "connected" are not limited to physical or mechanical connections, and may include electrical connections, whether direct or indirect.

The embodiments of the present disclosure will be described in detail below with reference to the drawings. The features of the following embodiments and implementations may be combined with each other without conflict.

Some embodiments of the present disclosure provide a display panel including: a substrate; and a pixel layer disposed on the substrate. The pixel layer includes a plurality of pixel units arranged in an array. The display panel has a plurality of pixel units surrounded by the plurality of pixel units. An orthographic projection of the main light-transmitting region on the substrate is not overlapped with orthographic projections of the plurality of pixel units on the substrate, so that external light may pass through the main light-transmitting region of the display panel, and then be received by an image acquisition device disposed on a side of the display panel.

The display panel according to the embodiments of the present disclosure does not need to provide a physical through-hole in the display panel, and only needs to provide a main light-transmitting region for light transmission. An area of the main light-transmitting region may be set to be very small, so that the main light-transmitting area is not easy to be perceived by human eyes, thereby achieving a high screen ratio of the display panel.

FIG. 1 is a schematic structural view of a display panel and an image acquisition device according to some embodiments of the present disclosure. As shown in FIG. 1, some embodiments of the present disclosure provide a display panel 11 that is applicable to a display device 10. The display device referred to herein may be a device having both a camera function and a display function, such as a mobile phone, a computer, a tablet, a smart watch, or the like. The display device may be a flexible display device, and of course, it may also be a non-deformable and non-inflexible display device. It should be noted that the display device referred to in the following embodiments is, for example, a mobile phone.

The display panel 11 includes a substrate 700, an electrical control layer 200 and a pixel layer 100, and the electrical control layer 200 and the pixel layer 100 are sequentially disposed on the substrate 700. In some embodiments, the display panel 11 may further include a protective layer overlying the pixel layer 100, and the protective layer is not shown in FIG. 1. The pixel layer 100 may realize the display function of the display panel 11 in a self-emitting form. The electrical control layer 200 is used to send electrical signals, such as voltage signals, to the pixel layer 100, to control the light emission of the pixel layer 100, thereby achieving the display function. The protective layer functions to encapsulate and protect the pixel layer 100 and the electrical control layer 200. The protective layer may be a glass cover plate, a flexible organic cover plate, or a laminated structure of an organic layer and an inorganic layer.

The pixel layer 100 includes a plurality of pixel units 110 arranged in an array. The electrical control layer 200 includes a plurality of switching elements 210 for controlling the plurality of pixel units 110, respectively. Each switching element 210 is disposed under a corresponding pixel unit 110 and is used to control the corresponding pixel unit 110. The electrical control layer 200 further includes metal wirings for providing electrical signals to the switching elements, such as a gate line, a data line, and the like.

In some embodiments, the display panel 11 is, for example, an OLED (Organic Light-Emitting Diode) display panel, and the pixel unit 110 is, for example, an OLED. The pixel unit 110 includes a cathode, an electron injection layer, an electron transport layer, an organic light emitting layer, a hole transport layer, a hole injection layer, and an anode which are sequentially arranged close to the base substrate 700 in a direction perpendicular to the substrate 700, that is, the cathode is disposed on a side of the anode away from the substrate 700. FIG. 1 shows only the anode layer of each pixel unit. The electrical control layer 200 is disposed between the substrate 700 and the pixel layer 100, and the anode of the pixel unit 110 is electrically connected to the switching element 210 in the electrical control layer 200 so that a voltage difference is generated between the anode and the cathode of the pixel unit 110 under the control of the electrical control layer 200 to form an electric field. Under the action of the electric field, holes generated by the anode of the pixel unit 110 migrate to the organic light-emitting layer through the hole injection layer and the hole transport layer, and electrons generated by the cathode of the pixel unit 110 migrate to the organic light-emitting layer through the electron injection layer and the electron transport layer. When holes and electrons meet in the organic light-emitting layer, energy excitons are generated, thereby exciting light-emitting molecules in the organic light-emitting layer to generate visible light.

As shown in FIG. 1, the electrical control layer 200 includes a buffer layer 260, an active layer, a first gate insulating layer, a first gate electrode layer, a second gate insulating layer, an interlayer dielectric layer 280, a source-drain electrode layer, and a planarization layer 290 which are sequentially arranged away from the substrate 700 in a direction perpendicular to the substrate 700. The electrical control layer 200 is provided with a plurality of switching elements 210, such as thin film transistors (TFTs). Each switching element 210 includes a source electrode 211, a drain electrode 212, a gate electrode 213, and an active layer pattern 214. The active layer pattern is located in the active layer and forms a channel of the switching element 210. The gate 213 is located in the first gate electrode layer and between the first gate insulating layer and the second gate insulating layer. The first gate insulating layer and the second gate insulating layer are collectively referred to as a gate insulating layer 270. As shown in FIG. 1, the gate electrode 213 is located in the gate insulating layer 270. The source electrode 211 and the drain electrode 212 are both located in the source-drain electrode layer. The source electrode 211 is electrically connected to one end of the active layer pattern through a via hole penetrating the interlayer dielectric layer 280 and the gate insulating layer 270, and the drain electrode 212 is electrically connected to the other end of the active layer pattern through another via hole penetrating the interlayer dielectric layer 280 and the gate insulating layer 270.

The pixel unit 110 is disposed on the planarization layer 290, and the anode of the pixel unit 110 is electrically connected to the source electrode 211 or the drain electrode 212 of the switching element 210 through a via hole passing through the planarization layer 290. FIG. 1 shows an example in which the anode of the pixel unit 110 is electrically connected to the drain electrode 212 of the switching element 210. As a result, the pixel unit 110 is electrically connected to the switching element 210 so that the switching element 210 supplies power to the anode of the pixel unit 110, so as to generate the voltage difference between the cathode and the anode.

In some embodiments, the electrical control layer 200 further includes metal wirings that provide electrical signals for the switching elements or the like, and further provide the electrical signals to the pixel units 110. The metal wirings are, for example, a gate line located in the first gate electrode layer, a data line in the source-drain electrode layer, or the like.

In some embodiments, as shown in FIG. 1, the substrate 700 includes a first PI (polyimide) layer 220, a second PI layer 240, and a first barrier layer 230 disposed between the first PI layer 220 and the second PI layer 240. Thereby, the substrate has better flexibility and also has better water and oxygen resistance. As shown in FIG. 1, the electrical control layer 200 is disposed on a side of the second PI layer 240 away from the first PI layer 220. A second barrier layer 250 is further provided between the substrate 700 and the electrical control layer 200 to further prevent outside water and/or oxygen from entering the OLED display panel, so as to prevent the OLED from being eroded.

In the display device, as shown in FIG. 1, the image acquisition device 300 is disposed on a side of the substrate 700 away from the electrical control layer 200, and the plurality of pixel units 110 are arranged on a first plane (e.g., a horizontal plane) parallel to the substrate 700. The display panel 11 has a main light-transmitting region 400 with an axis 401 along a second direction H (e.g., a vertical direction) perpendicular to the substrate 700, and the second direction H is perpendicular to the first plane. The main light-transmitting region 400 is surrounded by the plurality of pixel units 110, and an optical axis 301 of the image acquisition device 300 coincides with the axis 401 of the main light-transmitting region 400. In these embodiments, the pixel units 110 and the switching elements 210 are not located in the main light-transmitting region 400. Specifically, orthographic projections of the pixel units 110 on the substrate 700 do not overlap with an orthographic projection of the main light-transmitting region 400 on the substrate 700, and orthographic projections of the switching elements 210 on the substrate 700 do not overlap with the orthographic projection of the main light-transmitting region 400 on the substrate 700. Generally, the anode of the pixel unit 110 is made of a metal material, and the source electrode 211, the drain electrode 212, and the gate electrode 213 of the light-emitting element 210 are all made of a metal material. Metal materials generally have light-shielding properties. Therefore, by adopting the above design, the metal materials in the pixel units 110 and the switching elements 210 can be prevented from blocking light entering the image acquisition device 300. In some embodiments, the metal wirings in the electrical control layer 200 are not located in the main light-transmitting region 400. Specifically, an orthographic projection of the metal wirings on the substrate 700 does not overlap with the orthographic projection of the main light-transmitting region 400 on the substrate 700, thereby further avoiding the light entering the image acquisition device 300 from being blocked. In the embodiments, the layer structures in the main light-transmitting region 400 are all made of transparent materials, so that as much external light as possible may be obtained by the image acquisition device 300 through the main light-transmitting region 400 of the display panel 11 to achieve a better imaging effect.

In some embodiments, the orthographic projection of the main light-transmitting region 400 on the substrate 700 is in a shape of a square or a circle. In other embodiments, the orthographic projection of the main light-transmitting region 400 on the substrate 700 may have other shapes, such as rectangle, diamond, etc.

In some embodiments, in the direction parallel to the first plane, a cross-sectional area of the main light-transmitting region 400 (i.e., an area of the orthographic projection of the main light-transmitting region 400 on the substrate 700) is less than or equal to 2.25 mm$^2$. For example, the orthographic projection of the light-transmitting region 400 on the substrate 700 is in a shape of a square, and the side length of the square is 1.5 mm or less. In the above setting, the image acquisition device 300 may receive external light through the main light-transmitting region 400. Meanwhile, the pixel units 110, the switching elements 210, and the metal wirings avoid the main light-transmitting region 400, so that the image acquisition device 300 may obtain light normally. Compared with the solution in the related art in which a physical through-hole is provided in the display panel (a diameter or a side length of the physical through-hole is usually not less than 4 mm), a light-passing space provided for the image acquisition device 300 in the display panel 11 is reduced. Therefore, while the image acquisition device 300 realizes the camera function, the screen ratio of the display panel 11 is increased, thereby improving the user experience.

In some embodiments, in the direction parallel to the first plane, the cross-sectional area of the main light-transmitting region 400 (i.e., the area of the orthographic projection of the main light-transmitting region 400 on the substrate 700) is greater than or equal to $2.5 \times 10^5$ μm$^2$, and less than or equal to $1 \times 10^6$ μm$^2$. For example, the orthographic projection of the main light-transmitting region 400 on the substrate 700 is in a shape of a square, the side length of the square is greater than or equal to 500 μm and less than or equal to 1000 μm. The inventor has found through a large number of experimental tests that when the cross-sectional area of the main light-transmitting region 400 is greater than or equal to $2.5 \times 10^5$ μm$^2$ and less than or equal to $1 \times 10^6$ μm$^2$, it is possible to minimize the space occupied by the image acquisition device 300 on the display panel 11 while avoiding affecting the camera function of the image acquisition device 300 adversely. As a result, the screen ratio is increased. In this case, the main light-transmitting region 400 is not easily detected by human eyes.

In some embodiments, as shown in FIG. 1, the display panel further has a plurality of auxiliary light-transmitting regions 500 whose axes are in the second direction H. The pixel units 110 and the switching elements 210 are not located in the auxiliary light-transmitting regions 500. Specifically, the orthographic projections of the pixel units 110 on the substrate 700 do not overlap with orthographic projections of the auxiliary light-transmitting regions 500 on the substrate 700, and the orthographic projections of the switching elements 210 on the substrate 700 do not overlap with the orthographic projections of the auxiliary light-transmitting regions 500 on the substrate 700. Generally, the anode of the pixel unit 110 is made of a metal material, and the source electrode 211, the drain electrode 212, and the gate electrode 213 of the light-emitting element 210 are all made of a metal material. The metal material usually has the light-shielding property. Therefore, by adopting the above design, the metal materials in the pixel units 110 and the switching elements 210 can be prevented from blocking light entering the image acquisition device 300. In some embodiments, the metal wirings in the electrical control layer 200 are not located in the auxiliary light-transmitting regions 500, specifically, the orthographic projection of the metal wirings on the substrate 700 does not overlap the orthographic projections of the auxiliary light-transmitting regions 500 on the substrate 700, thereby further avoiding the light entering the image acquisition device 300 from being blocked. The plurality of auxiliary light-transmitting regions 500 are disposed around the main light-transmitting region 400. In the above setting, the auxiliary light-transmitting regions 500 are set to increase the light transmission amount of the display panel 11, so that the image acquisition device 300 may obtain more external light and improve the imaging quality, and it is also possible to improve the resolution of the image acquisition device 300 for high-frequency signals, that is, to improve the contrast ratio of the image acquisition device 300 for small features.

Figure 2:
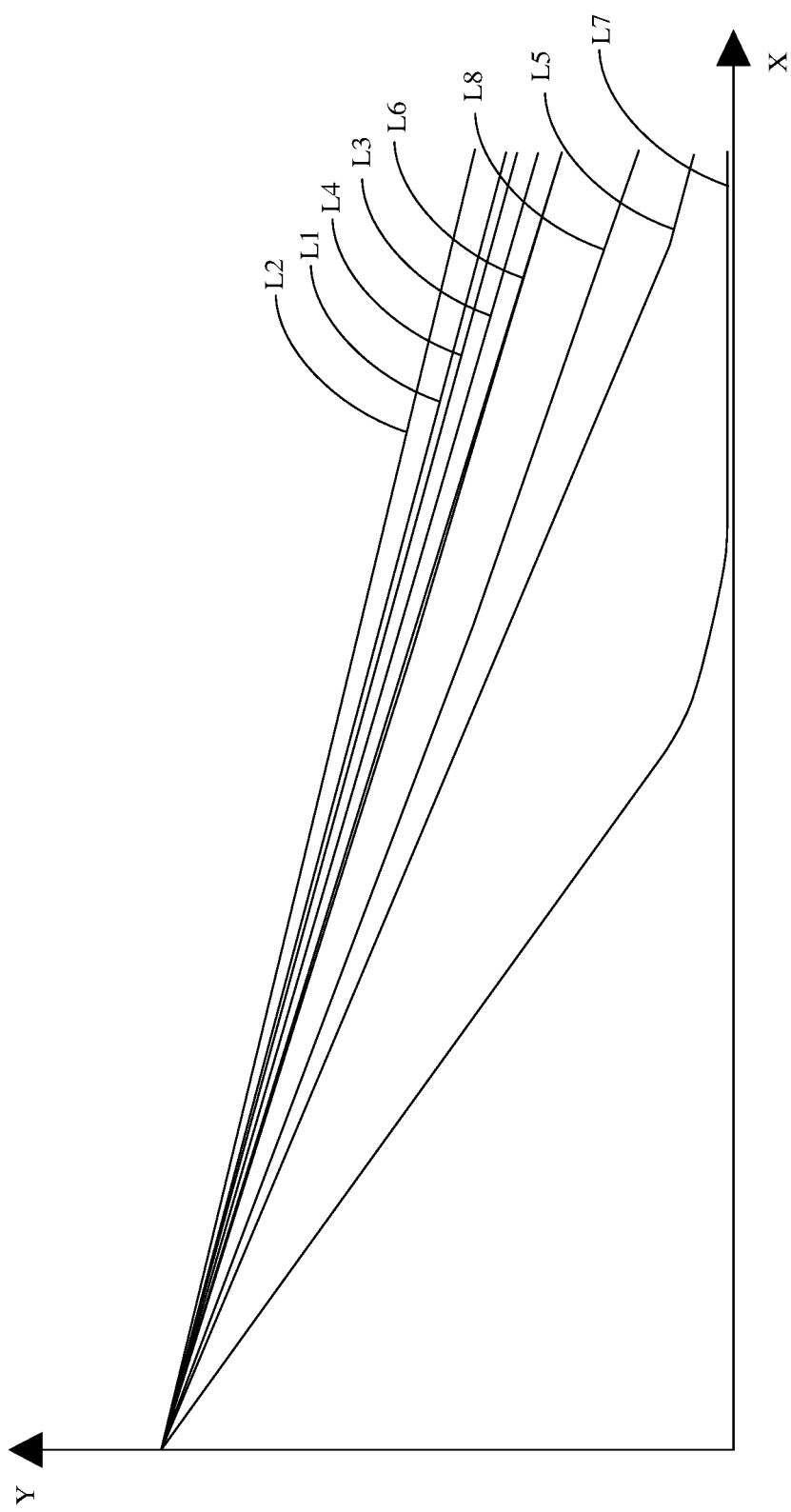
FIG. 2 shows modulation transfer function curves of an image acquisition device in a display device according to some embodiments of the present disclosure, wherein a display panel in the display device has only a main light-transmitting region.
Figure 3:
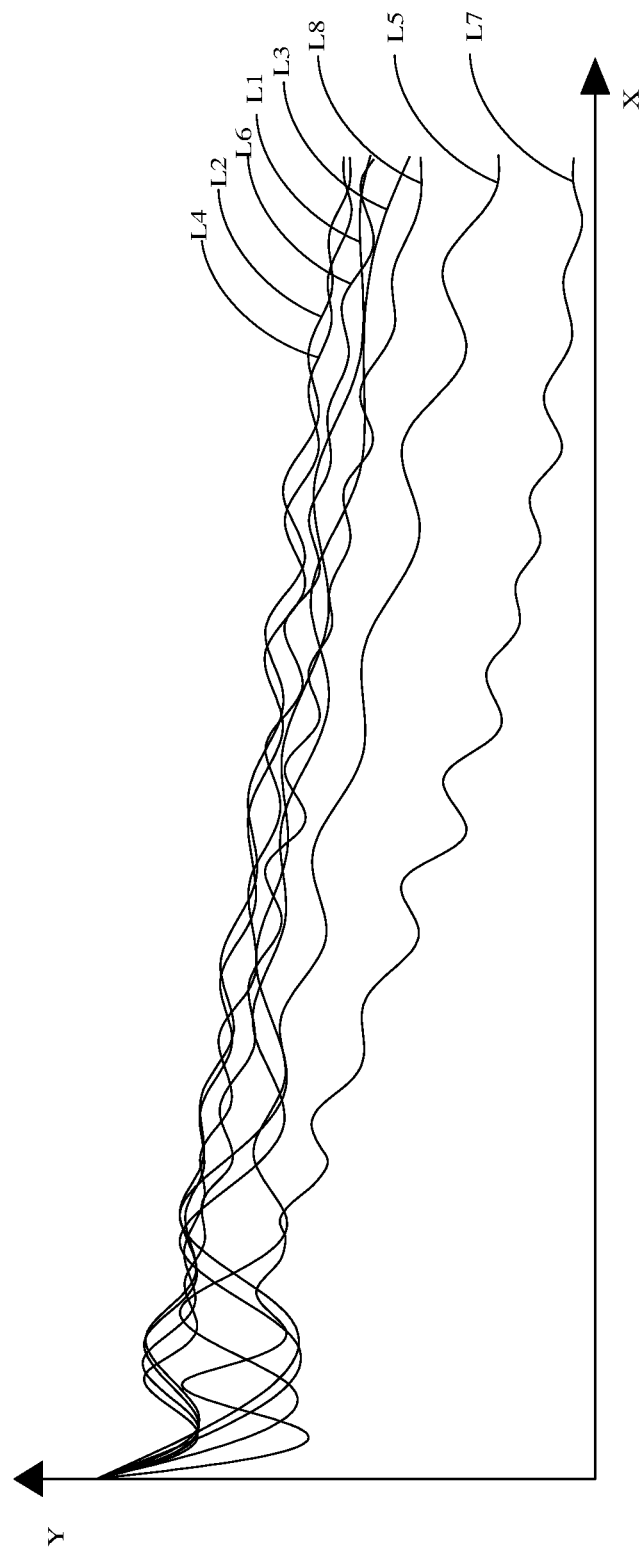
FIG. 3 shows modulation transfer function curves of an image acquisition device in a display device according to some embodiments of the present disclosure, wherein a display panel in the display device has a main light-transmitting region and a plurality of auxiliary light-transmitting regions.

When the display panel 11 is only provided with the main light-transmitting region 400, the modulation transfer function curves of the image acquisition device 300 is shown in FIG. 2; and when the display panel 11 is provided with the main light-transmitting region 400 and the auxiliary light-transmitting regions 500, the modulation transfer function curves of the image acquisition device 300 is shown in FIG. 3. In FIGS. 2 and 3, the X axis represents spatial frequency in line pair/mm (LP/mm), and the Y axis represents contrast ratio or sharpness. In the drawings, L1 is a modulation transfer function curve at 0° in the tangential direction, L2 is a modulation transfer function curve at 0° in the sagittal direction, L3 is a modulation transfer function curve at 15° in the tangential direction, and L4 is a modulation transfer function curve at 15° in the sagittal direction, L5 is a modulation transfer function curve at 31.5° in the tangential direction, L6 is a modulation transfer function curve at 31.5° in the sagittal direction, L7 is a modulation transfer function curve at 45° in the tangential direction, and L8 is a modulation transfer function curve at 45° in the sagittal direction. The angles described above are relative to the optical axis of the image acquisition device 300. Comparing FIG. 2 and FIG. 3, it can be seen that when the display panel 11 is provided with the auxiliary light-transmitting regions 500, the image acquisition device 300 has a higher imaging definition.

In some embodiments, the orthographic projection of each auxiliary light-transmitting region 500 on the substrate 700 is in a shape of a square or a circle. In other embodiments, the orthographic projection of each auxiliary light-transmitting region 500 on the substrate 700 may have other shapes, such as rectangle, diamond, etc.

In some embodiments, in the direction parallel to the first plane, a cross-sectional area of each auxiliary light-transmitting region 500 (an area of the orthographic projection of each auxiliary light-transmitting region 500 on the substrate 700) is less than or equal to 900 mm$^2$. For example, the orthographic projection of each auxiliary light-transmitting region 500 on the substrate 700 is in a shape of square, and the side length of the square is less than or equal to 30 mm. The inventor has found through a large number of experimental tests that when the cross-sectional area of each auxiliary light-transmitting region 500 is less than or equal to 900 mm$^2$, it is possible to reduce the occupation of the space of the display panel 11 while increasing the amount of light transmission. Specifically, the distance between adjacent pixel units in the OLED display panel is generally greater than 30 mm. Therefore, each auxiliary light-transmitting region 500 may be disposed between adjacent pixel units without affecting the effective display area of the display panel. In addition, when the cross-sectional area of each auxiliary light-transmitting region 500 is less than or equal to 900 mm$^2$, it is difficult for the user to observe the auxiliary light-transmitting regions 500, so that the interference of the auxiliary light-transmitting regions 500 to the display is minimized, and the screen ratio of the display panel is increased visually.

In some embodiments, as shown in FIG. 1, the electrical control layer 200 is further provided with a light-shielding layer 600. The light-shielding layer 600 is located on a side of the electrical control layer 200 facing the substrate 700 and between the buffer layer 260 and the substrate 700. The light-shielding layer 600 may avoid light diffraction caused by dense metal wirings in the electrical control layer 200. The light-shielding layer 600 is provided with a main opening 610 penetrating the light-shielding layer and a plurality of auxiliary openings 620 surrounding the main opening 610 and penetrating the light-shielding layer. In some embodiments, the main opening 610 defines the main light-transmitting region 400, and the auxiliary openings 620 define the auxiliary light-transmitting regions 500. Specifically, the orthographic projection of the main light-transmitting region 400 on the substrate 700 coincides with an orthographic projection of the main opening 610 on the substrate 700, and the orthographic projections of the plurality of auxiliary light-transmitting regions 500 on the substrate 700 coincide with orthographic projections of the plurality of auxiliary openings 620 on the substrate 700, respectively. Through the above-mentioned settings, the camera function of the image acquisition device 300 is ensured while avoiding light diffraction.

Figure 4:
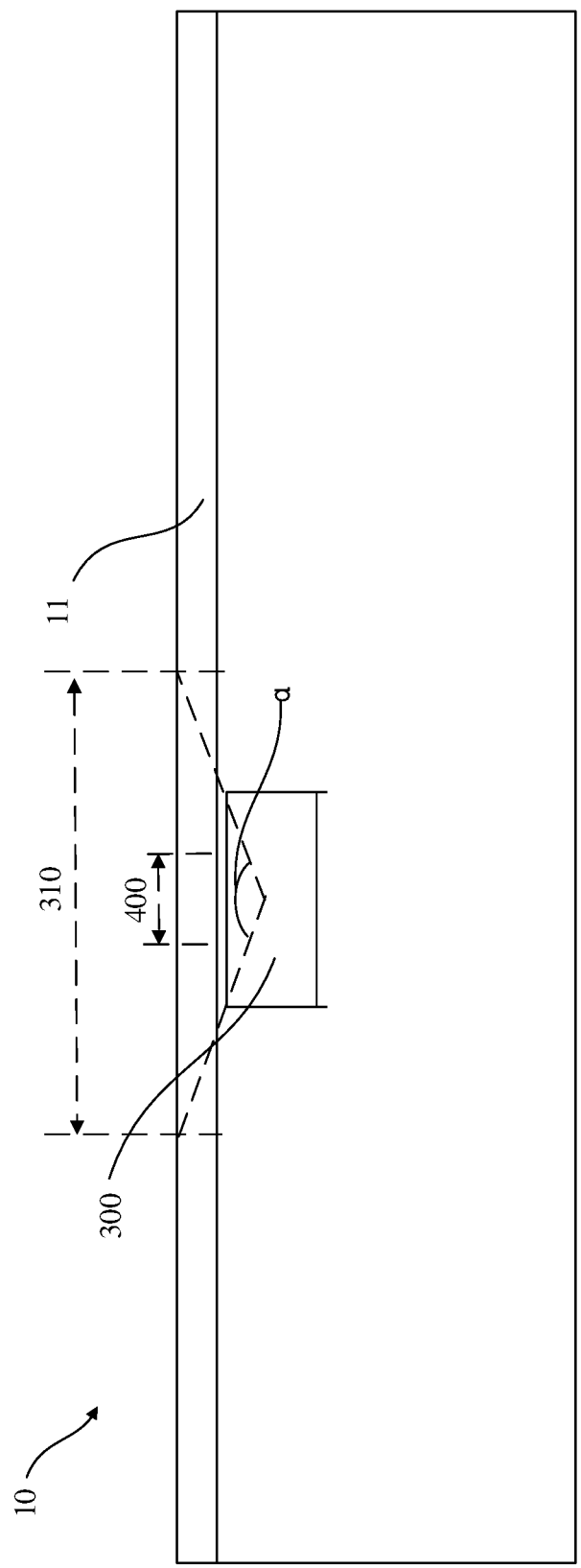
FIG. 4 is a schematic structural view of a display device according to some embodiments of the present disclosure.

Some embodiments of the present disclosure provide a display device. FIG. 4 is a schematic structural view of a display device according to some embodiments of the present disclosure. As shown in FIG. 4, and combined with FIGS. 1 and 5, the display device 10 includes a display panel 11 and an image acquisition device 300 located on a side of the display panel 11. Specifically, the image acquisition device 300 is located on an opposite side of the display surface of the display panel 11. The optical axis 301 of the image acquisition device 300 coincides with the axis 401 of the main light-transmitting region 400 perpendicular to the substrate 700. In actual use, the field of view angle α of the image acquisition device 300 has a fixed value, the field of view determined by the field of view angle α of the image acquisition device 300 intersects the display panel 11 to define an area 310 for the field of view on the display panel. The main light-transmitting region 400 is coaxial with the area 310 for the field of view. The plurality of auxiliary light-transmitting regions 500 surround the main light-transmitting region 400 and are evenly distributed in the area 310 for the field of view excluding the main light-transmitting region 400. Through the above-mentioned settings, the external light obtained by the image acquisition device 300 is increased to the greatest extent, the image plane illumination is enhanced, and the resolution of the image acquisition device 300 for high-frequency signals by is enhanced.

Figure 5:
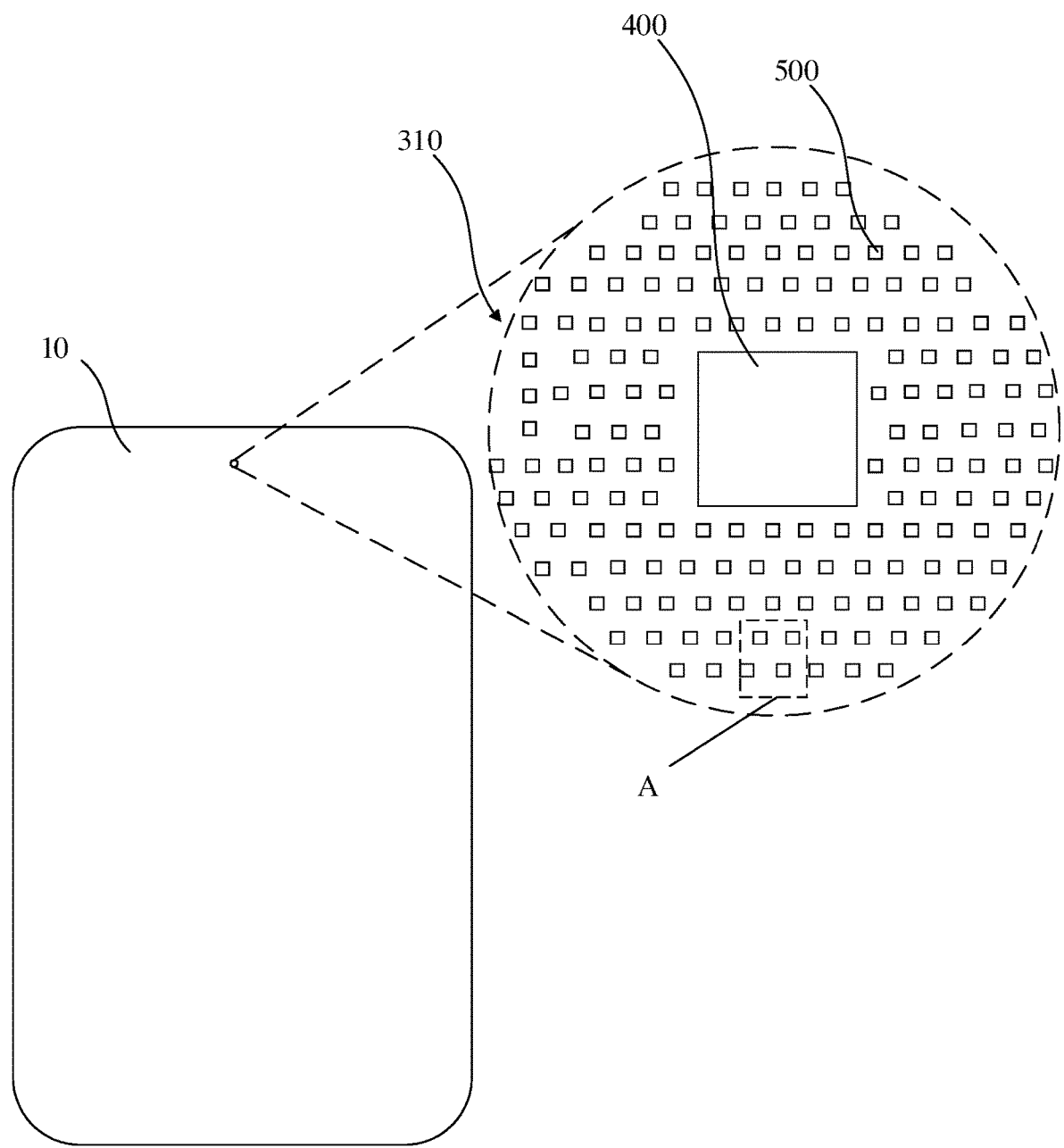
FIG. 5 is a schematic plan view of a display panel according to some embodiments of the present disclosure, wherein an enlarged schematic view of an area for a field of view is shown.

FIG. 5 is a schematic plan view of a display panel according to some embodiments of the present disclosure. The right side of the drawing is an enlarged schematic view of the area 310 for the field of view in the display panel 11. As shown in FIGS. 1 and 5, the main light-transmitting region 400 defined by the main opening 610 in the light-shielding layer 600 is surrounded by the plurality of auxiliary light-transmitting regions 500 defined by the plurality of auxiliary openings 620 in the light-shielding layer 600. The plurality of auxiliary light-transmitting regions 500 are evenly disposed in the area 310 for the field of view excluding the main light-transmitting region 400. In the embodiments, the main light-transmitting region 400 and the auxiliary light-transmitting regions 500 are all in a shape of a square. In other embodiments, the shapes of the main light-transmitting region 400 and the auxiliary light-transmitting regions 500 may also be circles, rectangles, or any other shapes, which do not affect the camera function of the image acquisition device 300.

Figure 6:
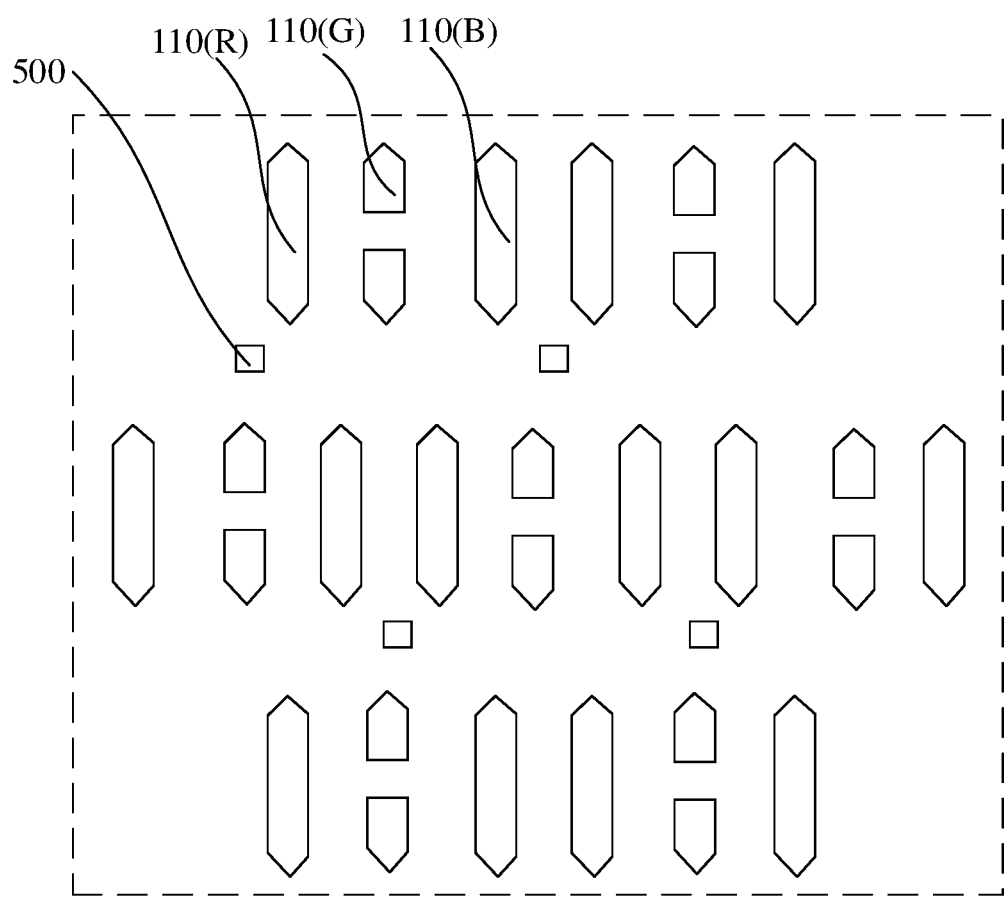
FIG. 6 is an enlarged schematic view of an area A in the display panel in FIG. 5, in which a pixel unit is shown.

FIG. 6 is an enlarged schematic view of an area A in the display panel in FIG. 5, in which the pixel units 110 are shown. The pixel unit 110 is, for example, a red sub-pixel R, a green sub-pixel G, or a blue sub-pixel B. As shown in FIG. 6, the plurality of pixel units 110 in the pixel layer 100 are spaced apart from each other, and each auxiliary light-transmitting region 500 is disposed between adjacent pixel units 110. Through the above settings, the auxiliary light-transmitting regions 500 may not affect the normal display of the display panel, the adverse influence of the auxiliary light-transmitting region on the visual effect is avoided to the greatest extent, and the screen ratio is increased.

Generally, the distance between adjacent pixel units 110 is greater than 30 mm, which is sufficient to accommodate the auxiliary light-transmitting region 500.

The above description is only the preferred embodiments of the present disclosure, and does not limit the disclosure in any form. Although the present disclosure has been disclosed as above with the preferred embodiments, it is not intended to limit the present disclosure. Any person skilled in the art may use the disclosed technical content to make some changes or modifications without departing from the scope of the technical solution of the present disclosure. Without departing from the content of the technical solution of the present disclosure, any simple amendments, equivalent changes, and modifications made to the above embodiments according to the technical essence of the present disclosure still fall within the scope of the technical solution of the present disclosure.

What is claimed is:

1. A display panel, comprising:
a substrate; and
a pixel layer disposed on the substrate, the pixel layer comprising a plurality of pixel units arranged in an array,
wherein the display panel comprises a main light-transmitting region surrounded by the plurality of pixel units, and an orthographic projection of the main light-transmitting region on the substrate is not overlapped with orthographic projections of the plurality of pixel units on the substrate, so that external light is allowed to pass through the main light-transmitting region of the display panel, and then is received by an image acquisition device disposed on a side of the display panel;
wherein the display panel further comprises a plurality of auxiliary light-transmitting regions, and the plurality of auxiliary light-transmitting regions surround the main light-transmitting region; and
wherein the plurality of auxiliary light-transmitting regions are arranged evenly and spaced apart from each other, and each auxiliary light-transmitting region is located between adjacent pixel units, and a layer structure in each auxiliary light-transmitting region is made of a transparent material.

2. The display panel according to claim 1, further comprising:
an electrical control layer between the substrate and the pixel layer, the electrical control layer comprising a metal wiring and a switching element which collectively provide signals for the plurality of pixel units,
wherein the orthographic projection of the main light-transmitting region on the substrate is not overlapped with orthographic projections of both the metal wiring and the switching element on the substrate.

3. The display panel according to claim 2, wherein the orthographic projection of the main light-transmitting region on the substrate is in a shape of a square or a circle.

4. The display panel according to claim 1, wherein an area of the orthographic projection of the main light-transmitting region on the substrate is less than or equal to 2.25 mm$^2$.

5. The display panel according to claim 4, wherein the area of the orthographic projection of the main light-transmitting region on the substrate is greater than or equal to $2.5 \times 10^5$ μm$^2$ and less than or equal to $1 \times 10^6$ μm$^2$.

6. The display panel according to claim 1, wherein an orthographic projection of each auxiliary light-transmitting region on the substrate is not overlapped with the orthographic projections of the plurality of pixel units on the substrate.

7. The display panel according to claim 1, wherein an orthographic projection of each auxiliary light-transmitting region on the substrate is not overlapped with the orthographic projections of both the metal wiring and the switching element on the substrate.

8. The display panel according to claim 1, wherein an area of an orthographic projection of each auxiliary light-transmitting region on the substrate is less than or equal to 900 µm².

9. The display panel according to claim 1, wherein an orthographic projection of each auxiliary light-transmitting region on the substrate is in a shape of a square or a circle.

10. The display panel according to claim 1, wherein the electrical control layer further comprises a light-shielding layer, the light-shielding layer is located on a side of the electrical control layer facing the substrate, and the light-shielding layer comprises a main opening and a plurality of auxiliary openings, each of the main opening and the auxiliary openings penetrating the light-shielding layer, and wherein the orthographic projection of the main light-transmitting region on the substrate coincides with an orthographic projection of the main opening on the substrate, and orthographic projections of the plurality of auxiliary light-transmitting regions on the substrate respectively coincide with orthographic projections of the plurality of auxiliary openings on the substrate.

11. A display device, comprising:

the display panel according to claim 1; and an image acquisition device on the side of the display panel, wherein an optical axis of the image acquisition device coincides with an axis of the main light-transmitting region perpendicular to the substrate.

12. The display device according to claim 11, wherein a field of view of the image acquisition device intersects with the display panel to define an area for the field of view on the display panel, the main light-transmitting region is located within the area for the field of view, and the main light-transmitting region is coaxial with the area for the field of view.

13. The display device according to claim 12, wherein the plurality of auxiliary light-transmitting regions are evenly distributed in the area for the field of view excluding the main light-transmitting region.

* * * * *